US006484521B2

(12) United States Patent
Patel et al.

(10) Patent No.: US 6,484,521 B2
(45) Date of Patent: Nov. 26, 2002

(54) SPRAY COOLING WITH LOCAL CONTROL OF NOZZLES

(75) Inventors: Chandrakant D. Patel, Fremont, CA (US); Cullen E. Bash, San Francisco, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/943,943

(22) Filed: Aug. 31, 2001

(65) Prior Publication Data

US 2002/0112497 A1 Aug. 22, 2002

Related U.S. Application Data

(60) Provisional application No. 60/271,276, filed on Feb. 22, 2001.

(51) Int. Cl.$^7$ .......................... F28D 3/00; F25D 23/12; H05K 7/20
(52) U.S. Cl. ................... 62/171; 62/259.2; 165/104.33; 361/699
(58) Field of Search .......................... 62/118, 119, 132, 62/171, 64, 259.2; 165/104.33, 908; 236/75; 239/132.5; 257/715; 361/699, 689, 698, 719, 721

(56) References Cited

U.S. PATENT DOCUMENTS

| | | | |
|---|---|---|---|
| 2,643,282 A | 6/1953 | Greene | 174/15 |
| 2,849,523 A | 8/1958 | Narbut | 174/15 |
| 2,858,355 A | 10/1958 | Narbut | 174/15 |
| 2,875,263 A | 2/1959 | Narbut | 174/15 |
| 4,141,224 A | 2/1979 | Alger et al. | 62/514 R |
| 4,290,274 A | 9/1981 | Essex | 62/157 |
| 4,352,392 A | 10/1982 | Eastman | 165/104.25 |

(List continued on next page.)

OTHER PUBLICATIONS

Sehmbey, M.S., Pais, M.R. and Chow, L.C., "Effect of Surface Material Properties and Surface Characteristics in Evaporative Spray Cooling," The Journal Of Thermophysics & Heat Transfer, Jul.–Sep., 1992, vol. 6, No. 3, pp 505–511.

Pais, Martin R., Chang, Ming J. Morgan, Michael J., and Chow, Louis C., Spray Cooling of a High Power Laser Diode, SAE Aerospace Atlanta Conference & Exposition, Dayton, Ohio, 1994, pp 1–6.

Morgan, Michael J., Chang, Won S., Pais, Martin R. and Chow, Louis C., "Comparison of High Heat–Flux Cooling Applications," SPIE, 1992, vol. 1739, pp17–28.

Lee, Chin C., andChien, David H., "Thermal and Package Design of High Power Laser Diodes," IEEE, 1993, Ninth IEEE Semi–Therm Symposium, pp 75–80.

Sehmbey, Mainder S., Chow, Louis C., Pais, Martin R. and Mahefkey, Tom, "High Heat Flux Spray Cooling of Electronics," American Institute Of Physics, Jan. 1995, pp 903–909.

Mudawar, I. and Estes, K.A., "Optimizing and Predicting CHF in Spray Cooling of a Surface of ," Journal Of Heat Transfer, Aug., 1996, vol. 118, pp 672–679.

Denney, D. Lawrence, "High Heat Flux Cooling Via a Monodisperse Controllable Spray", A Thesis Presented to The Academic Faculty of Georgia Institute of Technology in Partial Fulfillment of the Requirements for the Degree Master of Science in Mechanical Engineering, Mar. 1996.

Primary Examiner—Chen-Wen Jiang (57) ABSTRACT

A semiconductor chip cooling system configured with thermal inkjet type sprayers controlled by a control system. The control system can operate groups of the sprayers at different rates to controllably cool separate regions of a chip at different rates. A detection system is configured to separately detect the cooling regime occurring on the different regions of the chip by reflecting an optical beam off the chip in the region that is being sprayed.

21 Claims, 5 Drawing Sheets

U.S. PATENT DOCUMENTS

| | | |
|---|---|---|
| 4,490,728 A | 12/1984 | Vaught et al. ................ 346/1.1 |
| 4,500,895 A | 2/1985 | Buck et al. .............. 346/140 R |
| 4,559,789 A | 12/1985 | Riek ........................... 62/157 |
| 4,576,012 A | 3/1986 | Luzenberg ................... 62/157 |
| 4,683,481 A | 7/1987 | Johnson .................. 346/140 R |
| 4,685,308 A | 8/1987 | Welker et al. ................. 62/171 |
| 4,794,410 A | 12/1988 | Taub et al. ............. 346/140 R |
| 5,212,975 A * | 5/1993 | Ginzburg |
| 5,220,804 A | 6/1993 | Tilton et al. .................... 62/64 |
| 5,247,426 A | 9/1993 | Hamburgen et al. ........ 361/705 |
| 5,278,584 A | 1/1994 | Keefe et al. ............ 346/140 R |
| 5,434,606 A | 7/1995 | Hindagolla et al. ........... 347/45 |
| 5,718,117 A | 2/1998 | McDunn et al. ................ 62/64 |
| 5,724,824 A | 3/1998 | Parsons ....................... 62/171 |
| 5,797,274 A * | 8/1998 | Jackaman et al. ............. 62/171 |
| 5,907,473 A | 5/1999 | Prizilas et al. ............... 361/699 |
| 5,924,198 A | 7/1999 | Swanson et al. ........... 29/890.1 |
| 5,943,211 A | 8/1999 | Havey et al. ............... 361/699 |
| 5,992,159 A * | 11/1999 | Edwards et al. ................ 62/64 |
| 6,108,201 A | 8/2000 | Tilton et al. ................. 361/689 |
| 6,182,742 B1 | 2/2001 | Takahashi et al. ..... 165/104.33 |
| 6,205,799 B1 | 3/2001 | Patel et al. ................... 62/132 |

\* cited by examiner

SPRAY COOLING WITH LOCAL CONTROL OF NOZZLES

The present application claims priority from U.S. provisional patent application, Ser. No. 60/271,276, filed Feb. 22, 2001, which is incorporated herein by reference for all purposes.

The present invention relates generally to cooling systems for heat-generating devices and, more particularly, to a spray cooling system and a method of using the spray cooling system to cool semiconductor devices.

BACKGROUND OF THE INVENTION

With the advent of semiconductor devices having increasingly large component densities, the removal of heat generated by the devices has become an increasingly challenging technical issue. Extrapolating the ongoing changes in microprocessor organization and device miniaturization, one can project future power dissipation requirements of 100 W from a 1 cm by 1 cm core CPU surface area within the easily foreseeable future.

Furthermore, as semiconductor devices are designed with larger and larger component densities, greater numbers of functions are being designed into single semiconductor chips. For example, chips are presently available that carry multiple CPU modules along with a cache to support these CPUs. Chips can include numerous modules, such as application-specific integrated circuits (ICs), various forms of random access memory (RAM), and dc-dc converters. Each module on a chip can have different types of components, different component densities, and different times of high activity. Thus, each module can have significantly different power dissipation requirements from the others, with each module's dissipation requirements independently varying over time.

In the past, the low power dissipation of most chips accommodated the use of low cost, air-cooled heat sinks, which did not typically need to account for local differences in dissipation requirements across a chip. However, higher dissipation chips require substantially greater dissipation than air-cooled heat sinks could reasonably provide. Other known cooling methods for semiconductors include free-flowing and forced-liquid convection, pool boiling (i.e., boiling a liquid cooling fluid off a submerged device), and spray cooling (i.e., boiling a liquid cooling fluid off a device being sprayed with the liquid). Because liquids typically have a high latent heat of vaporization, these latter two methods provide for high heat-transfer efficiency, absorbing a large quantity of heat at a constant temperature.

Pool boiling is limited to a maximum power density, its critical heat flux (CHF). At higher densities, the vaporized cooling fluid forms a vapor barrier insulating the device from the liquid cooling fluid, thus allowing the wall temperature of the device to increase greatly. Spray cooling is also limited to a maximum power density, however, its CHF can be well over an order of magnitude higher than the CHF of a pool boiling system.

Critical to consistent, controlled spray cooling is the controlled application of the liquid cooling fluid in a desired flow rate, and velocity. To reach dissipation levels nearing the spray cooling CHF, the cooling fluid must be sprayed at a correct mass flow rate. At such a rate, vaporization occurs in the nucleate-boiling regime (i.e., the cooling fluid forms a thin film on the chip that vaporizes immediately). If the sprayer's mass flow rate is decreased below a minimum level for the nucleate boiling regime, then inadequate cooling fluid is available to dissipate the heat and it surpasses the spray cooling CHF (for that cooling fluid mass flow rate), and thus the cooling enters a dry-out regime where the chip's wall temperature increases substantially until radiant heat can dissipate the generated heat.

If, as the sprayer's mass flow rate is increased above a maximum level for the nucleate boiling regime, cooling fluid begins to pool on the chip, it enters a pool-boiling regime, which is equivalent to immersion and has substantially lower dissipation levels than the nucleate boiling regime. Thus, the temperature rises substantially until the necessary dissipation level is reached, either in nucleate boiling or radiant heating. Therefore, it is important for spray cooling to be conducted at a proper mass flow rate, maintaining a nucleate boiling regime (or close to it). This makes critical the design of the sprayer, i.e., the design of the nozzle and its related spray devices.

Figure 1:
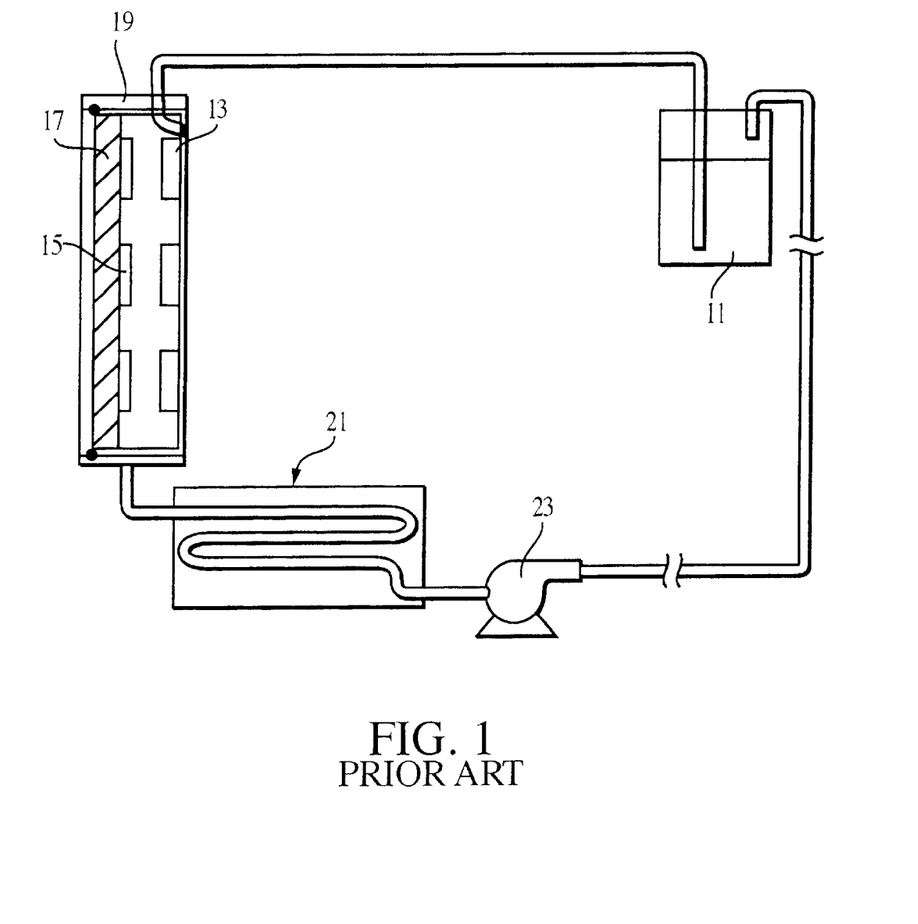
FIG. 1 is a system layout of a spray cooling system.

With reference to FIG. 1, in spray cooling, an inert spray coolant from a reservoir 11 is uniformly sprayed by a group of one or more sprayers 13 onto an aligned group of one or more chips 15 mounted on a printed circuit board 17. The coolant preferably evaporates, dissipating heat within the chip. The sprayers and chips, and the board, are mounted within sealed cases 19 fixed within an electronic device such as a computer system. The sprayed coolant is typically gathered and cooled within a condenser 21, and then routed back to the reservoir by a pump 23. The distance between the sprayers and the chips, and the mass flow rates for the sprayers, are typically selected based upon the chip with the highest dissipation requirements.

Typically, the cooling fluid used for spray cooling has a relatively low boiling point (the temperature to maintain) and is inert to the heat source. For semiconductor devices, low boiling point fluids such as 3M FC-72 (FED. CIR.-72, i.e., FLUORINERT®, sold by 3M Corporation) or PF-5060 are among a number of known suitable cooling liquids.

Current sprayer designs commonly employ either pressurized liquid spraying (i.e., pressure-assisted spraying) or pressurized gas atomizing. Because these devices are difficult to control, they are limited in their ability to limit "pooling" of the fluid (i.e., building up of liquid on the cooled device due to excessive spray rates). These cooling configurations typically spray a uniform or uncontrollably varied distribution of coolant across each chip.

However, higher dissipation chips can have substantially greater differences in dissipation across the chip, and as a result can develop detrimental thermal gradients. Additionally, spray cooling systems can develop efficiency problems when uniformly spraying chips having large dissipation variances. In particular, pooling can occur on one portion of a chip when it receives the required level of spray to cool a hotter portion of the chip. As a result, not only can the lower dissipation section end up operating at a significantly higher temperature, but the excess cooling fluid can run from one portion to another, causing further cooling problems. Thus, spray cooling systems can be very sensitive to dissipation rate gradients across the surface of a semiconductor chip.

Accordingly, there has existed a need for an easily maintainable spray cooling system that maximizes spray cooling efficiency for components having complex dissipation requirements, such as may be caused by providing numerous modules of different types within a semiconductor chip. This system preferably can be adapted for a variety of chips, and electronic systems using the cooling system preferably can be easily adapted to chip upgrades. Preferred embodiments of the present invention satisfy these and other needs, and provide further related advantages.

SUMMARY OF THE INVENTION

In various embodiments, the present invention solves some or all of the needs mentioned above by providing a cooling system that efficiently operates on one or possibly more high-dissipation devices, providing cooling to various regions of the devices at various dissipation rates.

A cooling system of the invention is typically configured for cooling a device having two or more regions characterized by different thermal dissipation rates. The system includes a sprayer head having one or more sprayers targeted to spray cooling fluid substantially at the first region of the device, and one or more sprayers targeted to spray cooling fluid substantially at the second region of the device. The invention features a control system configured to separately control the sprayers targeting the first and second regions such that the first region is sprayed with a cooling-fluid mass flow rate appropriate for dissipating the thermal energy of the first region at the first thermal dissipation rate, and such that the second region is sprayed with a cooling-fluid mass flow rate appropriate for dissipating the thermal energy of the second region at the second thermal dissipation rate.

This feature of the invention provides for the different regions of the device to be cooled at dissipation rates appropriate to their needs. In some instances, this will prevent local overheating that could occur from pooling or dry-out on one portion of the device.

The cooling system also features a detection system configured to separately detect whether pooling is occurring on one or more regions of the device. Using this feature, accurate determination of the appropriate spray rate can be ascertained, providing for optimal cooling rates over each region.

The cooling system further features a housing containing the sprayer head. The housing is configured such that, when the device is mounted on a substrate, the housing can adjoin the substrate to form a spray chamber containing the device. Advantageously, this feature provides for the cooling system and device to be combined into a compact and easily installable unit. As a result, electronic device manufacturers do not need to provide separate attention to sprayer assemblies, as they come attached to the device.

A method of the invention, for cooling a device having two or more regions characterized by separate and distinct thermal dissipation rates, comprises spraying the different regions of the device with cooling fluid. It further includes controlling the spraying of the regions such that cooling fluid is sprayed on each region at a mass flow rate appropriate for dissipating thermal energy from the region at the appropriate thermal dissipation rate.

Other features and advantages of the invention will become apparent from the following detailed description of the preferred embodiments, taken with the accompanying drawings, which illustrate, by way of example, the principles of the invention. The detailed description of particular preferred embodiments, as set out below to enable one to build and use an embodiment of the invention, are not intended to limit the enumerated claims, but rather, they are intended to serve as particular examples of the claimed invention.

DETAILED DESCRIPTION OF THE PREFERRED EMBODIMENTS

The invention summarized above and defined by the enumerated claims may be better understood by referring to the following detailed description, which should be read with the accompanying drawings. This detailed description of particular preferred embodiments of the invention, set out below to enable one to build and use particular implementations of the invention, is not intended to limit the enumerated claims, but rather it is intended to provide particular examples of them.

Typical embodiments of the present invention reside in a cooling system that is adaptable to individually cool different regions of a heat-producing component, where each region has differing heat dissipation requirements. Preferred embodiments of the invention are component-level assemblies containing the component, and containing detection systems to separately monitor the cooling regime occurring in each region of the component. With this technology, a computer system can use complex components having extreme and varying heat dissipation requirements, while allowing the components to be installed, replaced and/or upgraded with a minimum of additional work.

Figure 2:
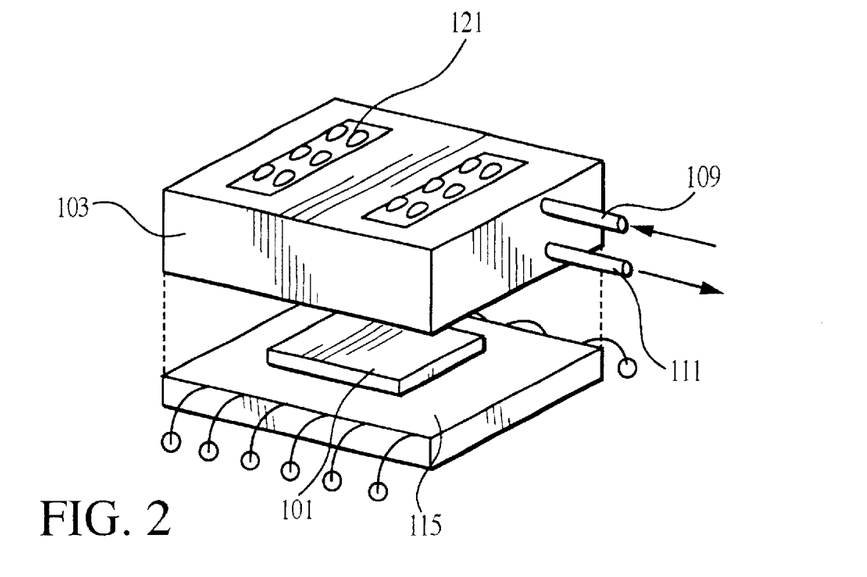
FIG. 2 is an exploded, perspective view of a cooling system embodying the invention.
Figure 3:
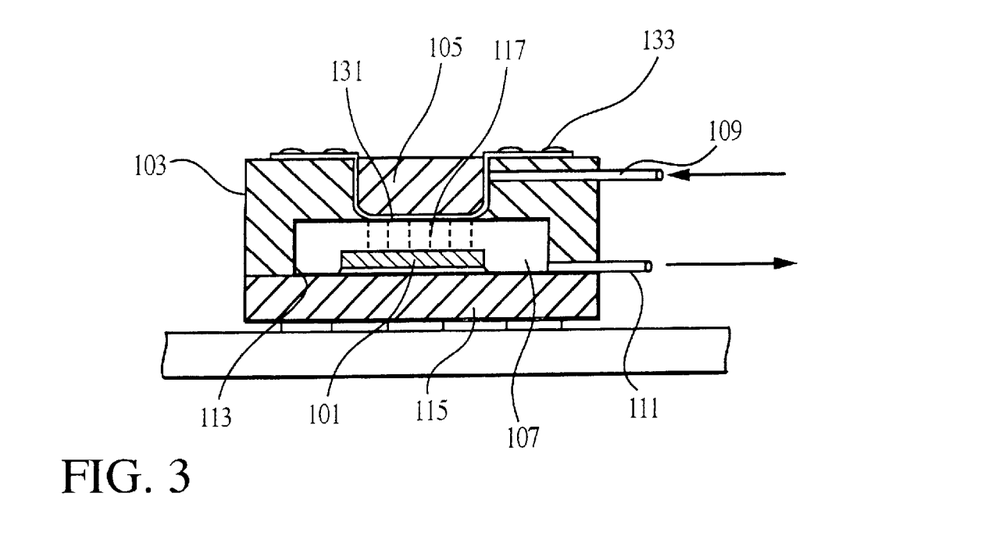
FIG. 3 is a cross-sectional, left side elevational view of the cooling system depicted in FIG. 2.

With reference to FIGS. 2 and 3, an embodiment of a cooling system is configured for cooling a component including a semiconductor chip 101. The cooling system includes a housing forming a cooling cap 103, and at least one spray head 105. The cooling cap and spray head are preferably integrated into a single cooling assembly, and with the component they form a cooled semiconductor assembly. The cap is configured to form a spray chamber 107 in which cooling fluid can be sprayed into thermal contact with, and preferably directly onto, the chip. The spray head includes an inlet 109 for receiving cooling fluid, preferably in a liquid state. An outlet 111 for liquid and/or gaseous cooling fluid preferably extends from the spray chamber. The inlet and outlet can lead to external cooling system components, such as a condenser and reservoir, or to components that are integral with the cooling cap.

Preferably, the cap 103 includes a concave portion having surfaces 113 that form a cavity configured to conformingly adjoin the component on one or more surfaces of a component substrate 115 that is both electrically connected to and carrying the chip 101. The component substrate and chip form the component, which can optionally include an encapsulant or lid. However, the package is preferably in the conventional form of an integrated circuit component that has not received an encapsulant or lid, as the cooling cap serves the function of covering and protecting the chip.

The spray head 105 is configured to spray cooling fluid 117 onto the chip 101, which heat and vaporize some, or more preferably all, of the cooling fluid. The cooling fluid vapor that forms during the cooling process is retained in the spray chamber 107 around the chip until it passes out the outlet 111.

Preferably, the spray head 105 is equipped with a large number of incremental sprayers, each configured and targeted to eject an incremental amount of the cooling fluid on a particular portion of the chip. The cooling fluid is typically sprayed in response to an energizing control signal, which is sent to the sprayer head by a controller. The quantity of liquid sprayed from incremental sprayers can be highly controllable, such as by separately controlling the rate at which incremental amounts of cooling fluid are ejected from each incremental sprayer.

For example, by increasing or decreasing the frequency that a particular group of incremental sprayers is energized, their flow rate can be accurately adjusted. Furthermore, because the sprayers targeting one region of a chip can be accurately controlled to deliver different flow rates than the sprayers over another region of the chip, the heat dissipation on different regions of the chip can be accurately and distinctly controlled by energizing one group of one or more sprayers at a rate greater than that of another group of one or more sprayers.

Figure 4:
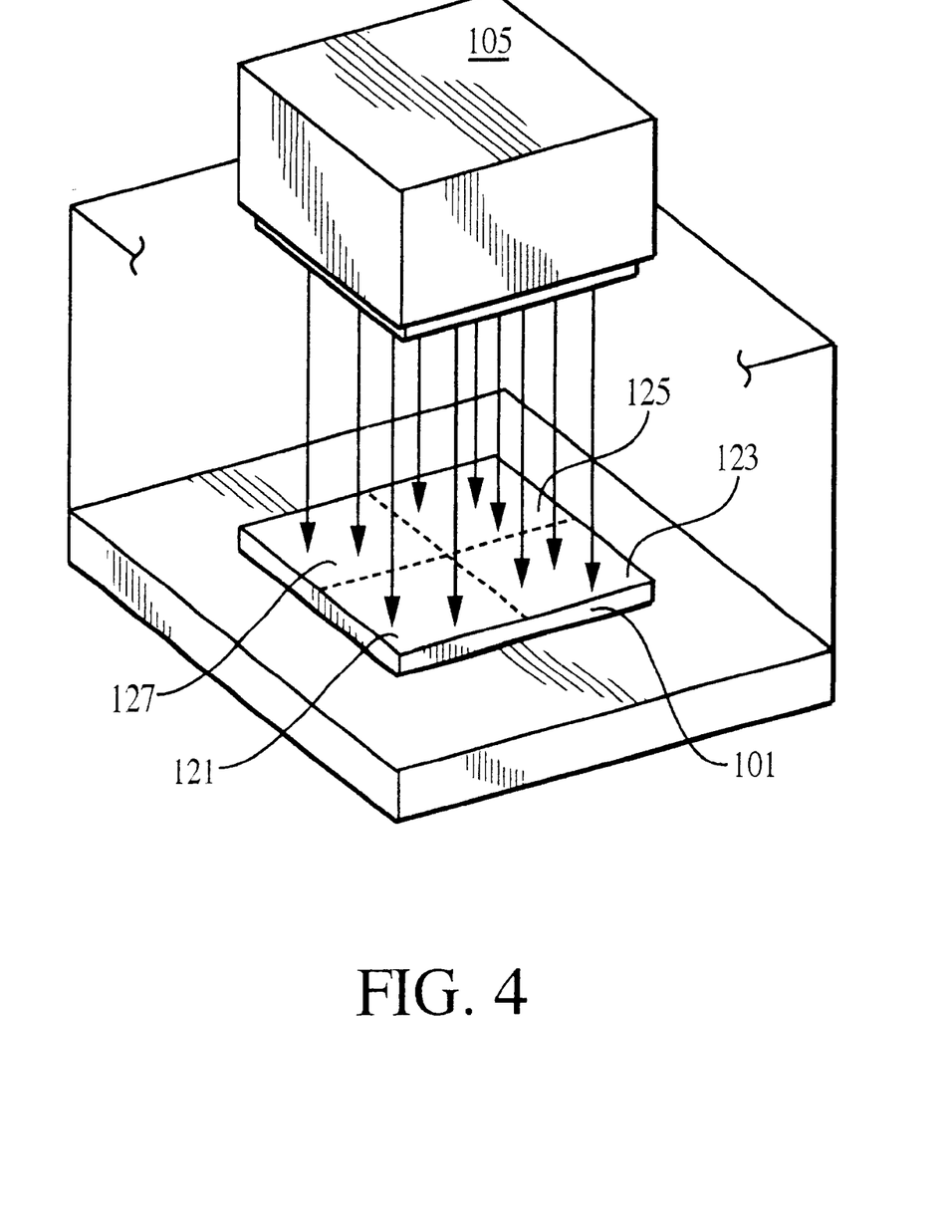
FIG. 4 is a perspective schematic view of a sprayer head and a semiconductor device from the cooling system depicted in FIG. 2.

With reference to FIG. 4, the chip 101 has various regions that operate at different power levels and require different heat dissipation rates. For example, a first CPU region 121 will operate at a greater power level than a first cache region 123 or a second cache region 125. A second CPU region 127 also operates at greater levels that do not necessarily coincide with the greater levels of the first CPU region. The sprayer head 105 has four groups of one or more, preferably incremental sprayers, each group being associated with and targeted at one of the four regions of the chip. Each group is separately controllable, thus allowing control over the dissipation level of each region of the chip.

The cooling system further includes a control system including a controller configured to control the fluid mass flow rate through the sprayers. In particular, the controller controls the mass flow rate through each group of sprayers. The control system provides the cooling system with the ability to cool different regions of the chip at different rates, each rate being appropriate to its related region's preferable heat flux. More preferably, the controller is configured to control the fluid mass flow rate through each sprayer, allowing the controller to be programmed with the configuration of the chip, and thereby determine the regions over which to operate. This feature provides for a system that adapts to a wide variety of chips. Optionally, the control system could provide mass flow rates that vary by some predetermined pattern over the chip, such as a mass flow rate that is maximum at a center of a hot region, and decreases with distance from that hot spot.

Figure 5:
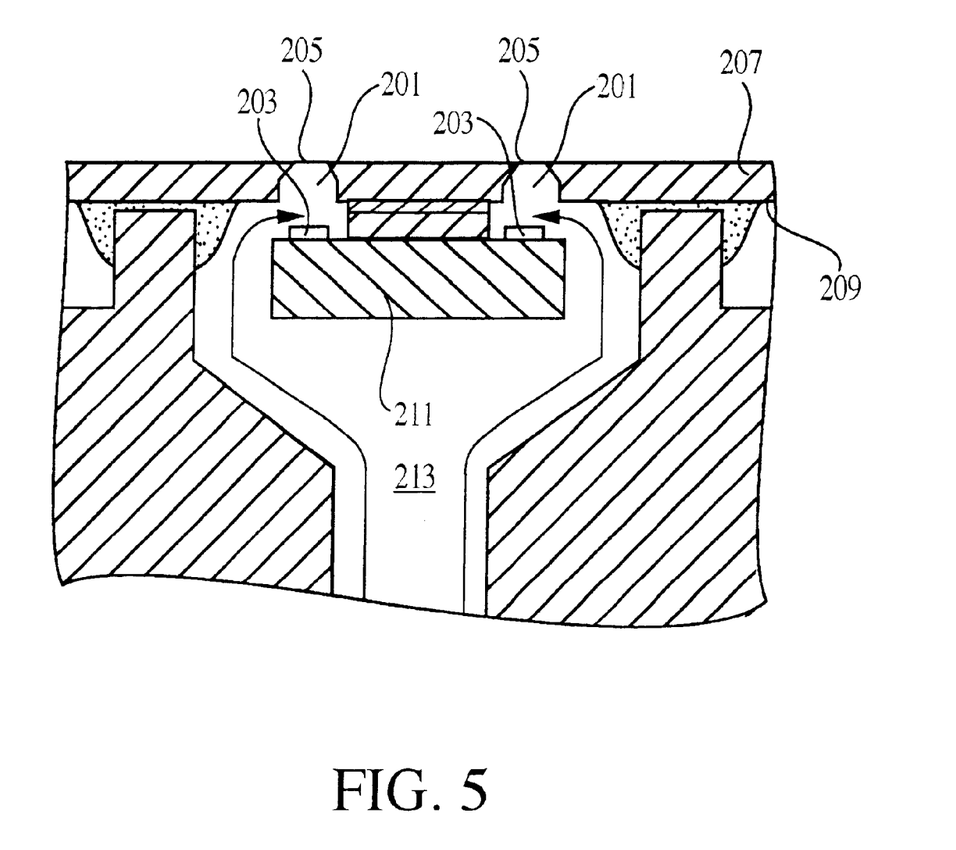
FIG. 5 is a cross-sectional view of a pair of incremental sprayers as used in the sprayer head depicted in FIG. 4.

With reference to FIGS. 3 and 5, a preferred type of incremental sprayer for the spray head 105 is an inkjet-type sprayer. The spray head includes a nozzle plate 131 that forms a plurality of thermal inkjet sprayers ("TIJ sprayers"). The nozzle plate is located on the cavity of the cap 103 so as to direct spray toward the chip through the spray chamber. The nozzle plate can be incorporated in a TIJ sprayer head, as is known in inkjet spray technology.

In particular, each TIJ sprayer includes structure defining an ejection chamber 201 for receiving a predetermined portion of cooling fluid, and a heater 203 for vaporizing a sub-portion of the predetermined portion of cooling fluid to create the pressure to eject an incremental amount of cooling fluid through an orifice 205 that directs the ejected cooling fluid toward the chip 101 (FIG. 3). The orifices are preferably formed in a flexible polymer tape 207, e.g., a polyimide tape such as is sold under the mark KAPTON.®

Affixed to a back surface 209 of the tape 207 is a silicon substrate 211 containing the heaters 203, in the form of individually energizable thin-film resistors. Each heater is preferably located on a side of the ejection chamber 201 across from the ejection chamber's orifice 205. Cooling fluid is preferably drawn and loaded into the ejection chamber by capillary action from a passage 213, as is typical for an ink-jet type device. Preferably, a computerized controller (not shown) energizes the heater, vaporizing the portion of the cooling fluid adjacent to the heater. The vaporized cooling fluid expands, expelling most of the non-vaporized cooling fluid out of the orifice, typically in the form of a single droplet.

Returning to FIGS. 2 and 3, the computerized controller is electrically connected to the heater via a plurality of contacts 133 mounted on the cap 103. The contacts are preferably integrated in the cap and exposed on its exterior. This can be done with a flex circuit connection, or for a ceramic cap, the electrical connections can be routed in ceramic. Optionally, the controller could be based in the chip 101 and signals routed through the component substrate 115 and cap via a connector (not shown).

The incremental sprayers can alternatively be based on other types of inkjet droplet expelling technology, such as piezoelectric technology (i.e., piezoelectric nozzles). Examples of this technology are discussed in numerous U.S. Patents, including U.S. Pat. Nos. 5,924,198, 4,500,895, and 4,683,481, which are incorporated herein by reference for all purposes. Other thermal ink-jet technologies, or other individually controllable sprayers can likewise be used. A highly preferable cooling fluid for use with a thermal incremental sprayer is 3M® corporation's NOVEC® dielectric fluids and FLUORINERT® coolants, which are adaptable to existing thermal ink-jet technology.

The spray cooling systems can feature the ejection of incremental amounts of a cooling fluid on the heat source, using the incremental sprayer, spaced over a number of time increments. Either the time between ejections or the incremental amount ejected can be varied to adjust the flow rate to an optimal level.

With reference to FIG. 4, the embodiment can select an optimal cooling-fluid mass flow rate for each region of the chip in a number of ways. In a first variation of the embodiment, the control system is configured to direct higher mass flow rates over regions of the chip known to produce higher levels of thermal energy on the average, such as the first CPU region 121 and the second CPU region 127. The mass flow rates for each region can be set based on the chip's architecture, or determined experimentally. Such experimental determination could be accomplished through a variety of methods, such as the measuring of temperatures on the chip while it is uniformly cooled, or such as the varying of coolant flux rates over various portions of the chip and monitoring either the temperature of the chip or the state of the sprayed cooling fluid. Other information can also be used to guide the mass flow rate determination, such as the activity level of the module in each region and/or the normal activity levels during different types of computational operations.

In a second variation of the embodiment, the control system can be configured to cause spray cooling bursts over either all of the chip, or various regions of the chip. Different regions of the chip can have bursts occurring at different frequencies or times.

In particular, two possible bursting patterns that are made possible in an incremental spray system are a "microburst" pattern and a "macroburst" pattern. In the microburst pattern, the frequency of incremental nozzle firing is adjusted, leading to a varying mass flow rate, preferably in a cyclic pattern. In a macroburst pattern, the duration of continuous spraying is interrupted with pauses, preferably while microbursting is occurring. If the pauses are regular, their frequency of occurrence defines a macroburst frequency. It is believed that the macroburst frequency could favorably affect a CHF, such as the dry-out CHF. The control over this frequency that incremental spraying, and particularly thermal-inkjet type spraying, allows potentially provides for control over bursting at a highly precise level, better enabling the microbursting and macrobursting. Optionally, during macrobursting the microburst frequency could be varied as a continuous function rather than in an on-off pattern. Also, optionally, the macrobursting could simply cyclically reduce the total mass flow for a limited and rather than eliminate it entirely.

In a third variation of the embodiment, the control system adjusts the cooling level in response to the activity level in some or all of the chip's regions. For example, the controller could increase the mass flow rate over a CPU region of the chip when the chip is in a state of high activity. Here, the activity level is used as an indicator that the region is producing more heat and/or getting hotter.

In a fourth variation of the embodiment, the control system includes a detection system having sensors that monitor various parameters indicative of the chip's state. The sensors can monitor the chip's temperature at various locations, and/or they can monitor parameters indicative of the cooling regime that is occurring at the chip's surface.

Figure 6:
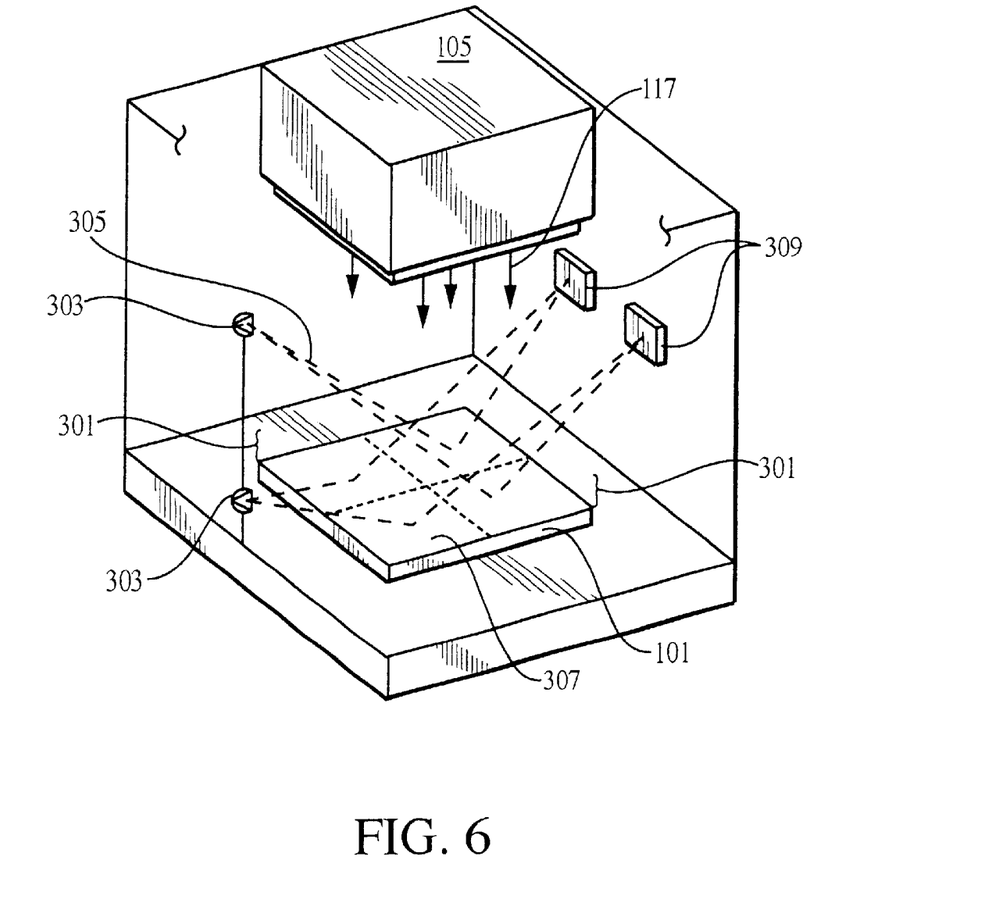
FIG. 6 is a perspective schematic view of a detection system used with the sprayer head and the semiconductor device depicted in FIG. 4.

With reference to FIG. 6, which depicts the operation of a detection system, the spray head 105 emits a spray of liquid cooling fluid 117 targeted at the chip 101. The cooling fluid enters a reaction zone 301 immediately adjacent a surface of the chip and comes into thermal contact with the surface, where the cooling fluid becomes significantly exposed to the heat being dissipated from the chip. The cooling fluid reacts to the heat's energy by convectively heating and/or evaporating.

The control system preferably controls the spray cooling rate to provide for the continuous evaporation of cooling fluid in the nucleate boiling regime without entering the critical heat flux regime, or alternatively, only entering the beginning of the critical heat flux regime. To observe and thereby controllably maintain a desired level of dissipation in a desired cooling regime, the detection system detects the dissipation level and/or cooling regime in the reaction zone 301, and thus the related wall temperature of the heat source.

In particular, the detection system includes two radiation sources 303, which are configured to emit radiant energy 305 through the reaction zone 301, impinging on the cooled surface 307 of the chip 101. The radiant energy is of a type that reflects off the cooled surface, and preferably is in the optical spectrum. The reflected radiant energy preferably passes again through the reaction zone, and then continues to be sensed by one of two radiation sensors 309, which are also part of the detection system.

Preferably, the radiation sources 303 and the radiation sensors 309 are placed close to the semiconductor device 101. The sources direct the radiant energy 305 onto the heat source's surface and the sensors collect the reflected radiant energy, producing a signal having an intensity proportional to the reflected radiant energy's intensity. The type of radiant energy is selected such that the reflected radiant energy will be partially obstructed, and will therefore vary in intensity, as it passes through the reaction zone 301. This intensity change will vary depending on the state of the cooling fluid in the reaction zone, and thus it will be indicative of the cooling regime occurring at the time. In particular, the intensity will vary as the cooling regime moves from the nucleate boiling regime to the critical heat flux regime or the dry-out regime in the reaction zone.

The controller can be calibrated to recognize the meaning of these differences in intensity, relative to the emitted energy, by using data from experimental tests where other types of dissipation and/or cooling regime detection are also employed to determine the dissipation level and/or cooling regime. When the controller is calibrated to known reactions, the detection system can thus detect the cooling regime by noting changes in the radiation sensor's detection-signal strength.

The radiation sources and sensors are preferably positioned so that, in different combinations, they can be used to detect the cooling regime occurring in each region of the chip. The radiation sources can be used sequentially so that each sensor can differentiate between the sources of the radiant energy received, or each source can emit radiation that can be filtered from the other.

A useful aspect of many embodiments of the invention related to this first embodiment is that it forms an extremely compact cooling system that can be universally applicable across various types of heat-producing components in a wide array of products, from servers to workstations and beyond. The controller can be programmed to adapt to the configuration of its particular chip. Preferably, each cooling cap is integrated into the package of a high-power/high-performance chip or set of chips, thereby allowing the cooling system assembly process to be simplified down to the simple attaching of cooling fluid lines to the cooled package's inlet and outlet. The resulting system would preferably have a plurality of cooled semiconductor assemblies that are electronically interconnected and that share some cooling components such as condensers and pumps.

Other embodiments of the invention can have a wide variety of spray chamber housings. The spray chambers can be of a variety of sizes, carry any number of sprayer assemblies and can contain any number of chips. It should be understood that the invention comprises apparatus and methods for designing cooling systems and for producing cooling systems, as well as the apparatus and methods of the cooling system itself. Additionally, the various embodiments of the invention can incorporate various combinations of the features disclosed above in generally discussing an inkjet spray cooling system, and can be designed, made and operated using related methods (or portions thereof) as described above for the inkjet spray cooling system.

Alternate variations of these embodiments could comprise other types of incremental spray heads, such as piezoelectric sprayers, or other spray heads. In short, the above disclosed features can be combined in a wide variety of configurations within the anticipated scope of the invention. Furthermore, embodiments of the invention can incorporate various combinations of the spray cooling apparatus described in U.S. Pat. No. 6,205,799, which is incorporated herein by reference for all purposes.

While particular forms of the invention have been illustrated and described, it will be apparent that various modifications can be made without departing from the spirit and scope of the invention. For example, while the invention was discussed for electronic devices, the cooling of optical devices could also be accomplished using the invention. Thus, although the invention has been described in detail with reference only to the preferred embodiments, those having ordinary skill in the art will appreciate that various modifications can be made without departing from the scope of the invention. Accordingly, the invention is not intended to be limited by the above discussion, and is defined with reference to the following claims.

We claim:

1. A method for cooling an electronic or optical component having first and second regions characterized by first and second thermal dissipation rates, respectively, comprising:

spraying both the first and second regions of the electronic or optical component with cooling fluid; and controlling the spraying of the first and second regions such that cooling fluid is sprayed on the first region at a mass flow rate appropriate for dissipating thermal energy from the first region at the first thermal dissipation rate, and such that cooling fluid is sprayed on the second region at a mass flow rate appropriate for dissipating thermal energy from the second region at the second thermal dissipation rate.

2. The method of claim 1, wherein in the step of spraying, the first region is uniformly sprayed at the mass flow rate appropriate for dissipating thermal energy from the first region at the first thermal dissipation rate, and the second region is uniformly sprayed at the mass flow rate appropriate for dissipating thermal energy from the second region at the second thermal dissipation rate.

3. The method of claim 1, wherein the step of controlling comprises:

detecting whether pooling is occurring on the first region; and adjusting the mass flow rate with which the first region is sprayed based upon the detection of whether pooling is occurring on the first region.

4. The method of claim 3, wherein the step of controlling further comprises:

detecting a temperature in the first region; and adjusting the mass flow rate with which the first region is sprayed based upon the detected temperature in the first region.

5. The method of claim 3, wherein the step of controlling further comprises:

detecting whether pooling is occurring on the second region; and adjusting the mass flow rate with which the second region is sprayed based upon the detection of whether pooling is occurring on the second region.

6. The method of claim 1, wherein the step of controlling comprises:

detecting whether dry-out is occurring on the first region; and adjusting the mass flow rate with which the first region is sprayed based upon the detection of whether dry-out is occurring on the first region.

7. The method of claim 6, wherein the step of controlling further comprises:

detecting a temperature in the first region; and adjusting the mass flow rate with which the first region is sprayed based upon the detected temperature in the first region.

8. The method of claim 6, wherein the step of controlling further comprises:

detecting whether pooling is occurring on the second region; and adjusting the mass flow rate with which the second region is sprayed based upon the detection of whether pooling is occurring on the second region.

9. The method of claim 1, and further comprising:

enclosing the first and second regions in a housing defining a spray chamber, wherein the step of spraying is conducted in the spray chamber.

10. The method of claim 1, wherein the step of spraying comprises ejecting incremental quantities of cooling fluid from a spray nozzle in response to a control signal.

11. An apparatus for cooling an electronic or optical component having first and second regions characterized by first and second thermal dissipation rates, respectively, comprising:

means for spraying both the first and second regions of the electronic or optical component with cooling fluid; and means for controlling means of spraying such that cooling fluid is sprayed on the first region at a mass flow rate appropriate for dissipating thermal energy from the first region at the first thermal dissipation rate, and such that cooling fluid is sprayed on the second region at a mass flow rate appropriate for dissipating thermal energy from the second region at the second thermal dissipation rate.

12. A cooling system for cooling an electronic or optical component having first and second regions characterized by first and second thermal dissipation rates, respectively, comprising:

a sprayer head having a first portion and a second portion, the first portion having one or more sprayers targeted to spray cooling fluid substantially at the first region of the electronic or optical component, and the second portion having one or more sprayers targeted to spray cooling fluid substantially at the second region of the electronic or optical component; and a control system configured to individually control each sprayer head portion such that the first sprayer head portion has a cooling-fluid mass flow rate appropriate for dissipating the thermal energy of the first region at the first thermal dissipation rate, and such that the second sprayer head portion has a cooling-fluid mass flow rate appropriate for dissipating the thermal energy of the second region at the second thermal dissipation rate.

13. The cooling system of claim 12, wherein the electronic or optical component includes a substrate, and further comprising a housing containing the sprayer head, the housing being configured to adjoin the substrate, and the housing having a cavity that forms a spray chamber containing the regions of the electronic or optical component when the housing is adjoined to the substrate.

14. The cooling system of claim 12, and further comprising a detection system configured to detect whether pooling is occurring on the first region.

15. The cooling system of claim 12, and further comprising a sensor system configured to detect whether pooling is occurring on the first region, and configured to separately detect whether pooling is occurring on the second region.

16. The cooling system of claim 15, wherein the sensor system comprises a light source and an optical detector.

17. The cooling system of claim 12, wherein each sprayer is configured as an incremental sprayer.

18. The cooling system of claim 12, wherein each sprayer is configured as a thermal inkjet-type sprayer.

19. A cooled semiconductor assembly, comprising:

a semiconductor device mounted on a substrate, the device having first and second regions characterized by first and second thermal dissipation rates, respectively;

a housing configured to adjoin the substrate, the housing having a cavity that forms a spray chamber containing the device when the housing is adjoined to the substrate;

a sprayer head mounted in the housing, the sprayer head having a first portion and a second portion, the first portion having one or more sprayers targeted to spray cooling fluid substantially at the first region of the device, and the second portion having one or more sprayers targeted to spray cooling fluid substantially at the second region of the device; and a control system configured to individually control each sprayer head portion such that the first sprayer head portion has a cooling-fluid mass flow rate appropriate for dissipating the thermal energy of the first region at the first thermal dissipation rate, and such that the second sprayer head portion has a cooling-fluid mass flow rate appropriate for dissipating the thermal energy of the second region at the second thermal dissipation rate.

20. An electronic device, comprising a first cooled semiconductor assembly of claim 19;

a second cooled semiconductor assembly of claim 19 electronically linked to the first cooled semiconductor assembly; and a condenser configured to cool cooling fluid sprayed by both the first and second cooled semiconductor devices.

21. A method for cooling a semiconductor device having first and second regions characterized by first and second thermal dissipation rates, respectively, comprising:

spraying the device with a sprayer head having a first portion and a second portion, the first portion having one or more sprayers targeted to spray cooling fluid substantially at the first region of the device, and the second portion having one or more sprayers targeted to spray cooling fluid substantially at the second region of the device; and controlling the sprayers of each sprayer head portion such that the first sprayer head portion has a cooling-fluid mass flow rate appropriate for dissipating the thermal energy of the first region at the first thermal dissipation rate, and such that the second sprayer head portion has a cooling-fluid mass flow rate appropriate for dissipating the thermal energy of the second region at the second thermal dissipation rate.

* * * * *